(12) United States Patent
Dinc et al.

(10) Patent No.: US 12,712,245 B2
(45) Date of Patent: Aug. 18, 2026

(54) GAIN INVARIANT BIDIRECTIONAL PHASE SHIFTER

(71) Applicant: TEXAS INSTRUMENTS INCORPORATED, Dallas, TX (US)

(72) Inventors: Tolga Dinc, Dallas, TX (US); Swaminathan Sankaran, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 382 days.

(21) Appl. No.: 17/899,445

(22) Filed: Aug. 30, 2022

(65) Prior Publication Data

US 2024/0072402 A1 Feb. 29, 2024

(51) Int. Cl.

*H01P 1/185* (2006.01)
*H01P 5/18* (2006.01)
*H03F 3/24* (2006.01)

(52) U.S. Cl.

CPC ................ *H01P 1/185* (2013.01); *H01P 5/18* (2013.01); *H03F 3/245* (2013.01); *H03F 2200/451* (2013.01)

(58) Field of Classification Search

CPC . H01P 1/185; H01P 5/18; H03F 3/245; H03F 2200/451

See application file for complete search history.

(56) References Cited

U.S. PATENT DOCUMENTS

2005/0040874 A1* 2/2005 Allison .................. H01P 1/127 327/231
2008/0002788 A1 1/2008 Akhtar
2015/0270821 A1* 9/2015 Natarajan ................ H03H 7/20 455/78
2017/0194688 A1 7/2017 Sharma
2018/0006352 A1 1/2018 Issakov
2018/0337658 A1 11/2018 Vaesen
2020/0091605 A1* 3/2020 Ngai ...................... H04B 7/084
2020/0220524 A1* 7/2020 Hong ...................... H03M 1/66
2021/0175589 A1* 6/2021 Patel ...................... H03H 11/20
2023/0093885 A1* 3/2023 Ella .......................... H03H 9/60 333/187

OTHER PUBLICATIONS

International Searching Authority, PCT Search Report , mailed Dec. 19, 2023, 3 pages.

International Searching Authority, Written Opinion, mailed Dec. 19, 2023, 4 pages.

Rasheen et al., A Differential Reflection-Type Phase Shifter Based on CPW Coupled-Line Coupler in 45nm CMOS SOI', Published in: 2019 16th International Symposium on Wireless Communication Systems (ISWCS), Oct. 21, 2019.

* cited by examiner

*Primary Examiner* — Samuel S Outten
(74) *Attorney, Agent, or Firm* — Zhenhai Fu; Frank D. Cimino

(57) ABSTRACT

A bidirectional phase shifter includes a differential quadrature hybrid coupler, a switch network, and a differential reflection type phase shifter (RTPS). The differential quadrature hybrid coupler includes a first phase input/output (I/O) port, an inverse first phase I/O port, a second phase I/O port, and an inverse second phase I/O port. The switch network is coupled to the first phase I/O port, the inverse first phase I/O port, the second phase I/O port, and the inverse second phase I/O port. The differential RTPS including a differential I/O port coupled to the switch network.

16 Claims, 8 Drawing Sheets

GAIN INVARIANT BIDIRECTIONAL PHASE SHIFTER

BACKGROUND

Beamforming is used a wide variety of applications. For example, beamforming may be used to wireless communication, radar, sonar, medical imaging, and audio applications. Beamforming focuses signals transmitted in or received from a selected direction to improve signal-to-noise ratio. In receiver applications, a beamformer coherently sums signals across receiver elements to enhance detection. In transmitter applications, a beamformer focus signal from transmitter elements toward a selected receiver location.

SUMMARY

In one example, a bidirectional phase shifter includes a differential quadrature hybrid coupler, a switch network, and a differential reflection type phase shifter (RTPS). The differential quadrature hybrid coupler includes a first phase input/output (I/O) port, an inverse first phase I/O port, a second phase I/O port, and an inverse second phase I/O port. The switch network is coupled to the first phase I/O port, the inverse first phase I/O port, the second phase I/O port, and the inverse second phase I/O port. The differential RTPS including a differential I/O port coupled to the switch network.

In another example, a bidirectional phase shifter includes a differential RTPS. The differential RTPS includes a differential I/O port, a quadrature hybrid coupler, a resonator circuit, and a variable resistor. The quadrature hybrid coupler includes a first port and a second port. The first port is coupled to the differential I/O port. The resonator circuit includes a first terminal, a control terminal, and a variable capacitor. The first terminal is coupled to the second port of the hybrid coupler. The variable capacitor is coupled to the control terminal. The variable resistor includes a first terminal and a control terminal. The first terminal of the variable resistor is coupled to the second port of the quadrature hybrid coupler. The control terminal of the variable resistor is coupled to the control terminal of the resonator circuit.

In a further example, a beamforming circuit includes a bidirectional channel. The bidirectional channel includes a first I/O port, a second I/O port, and a bidirectional phase shifter coupled between the first I/O port and the second I/O port. The bidirectional phase shifter includes a quadrant select circuit and a differential RTPS. The quadrant select circuit is configured to shift a received signal to a selected phase quadrant. The differential RTPS is coupled to the quadrant select circuit. The differential RTPS is configured to apply a variable phase shift to the received signal within the selected phase quadrant.

DETAILED DESCRIPTION

Beamformers may be implemented using active or passive phase shifters. With active phase shifters, a separate phase shifter and attenuator are provided in each receive channel and each transmit channel. Passive phase shifters support bidirectional operation. With passive phase shifters, beamformer circuitry can be simplified by sharing a single phase shifter and a single attenuator in each transmit/receive channel.

In communication systems (e.g., satellite communication systems, 5th generation mobile networks), orthogonal phase and amplitude control aids in reducing calibration complexity for beam-steering and sidelobe suppression.

Figure 1A:
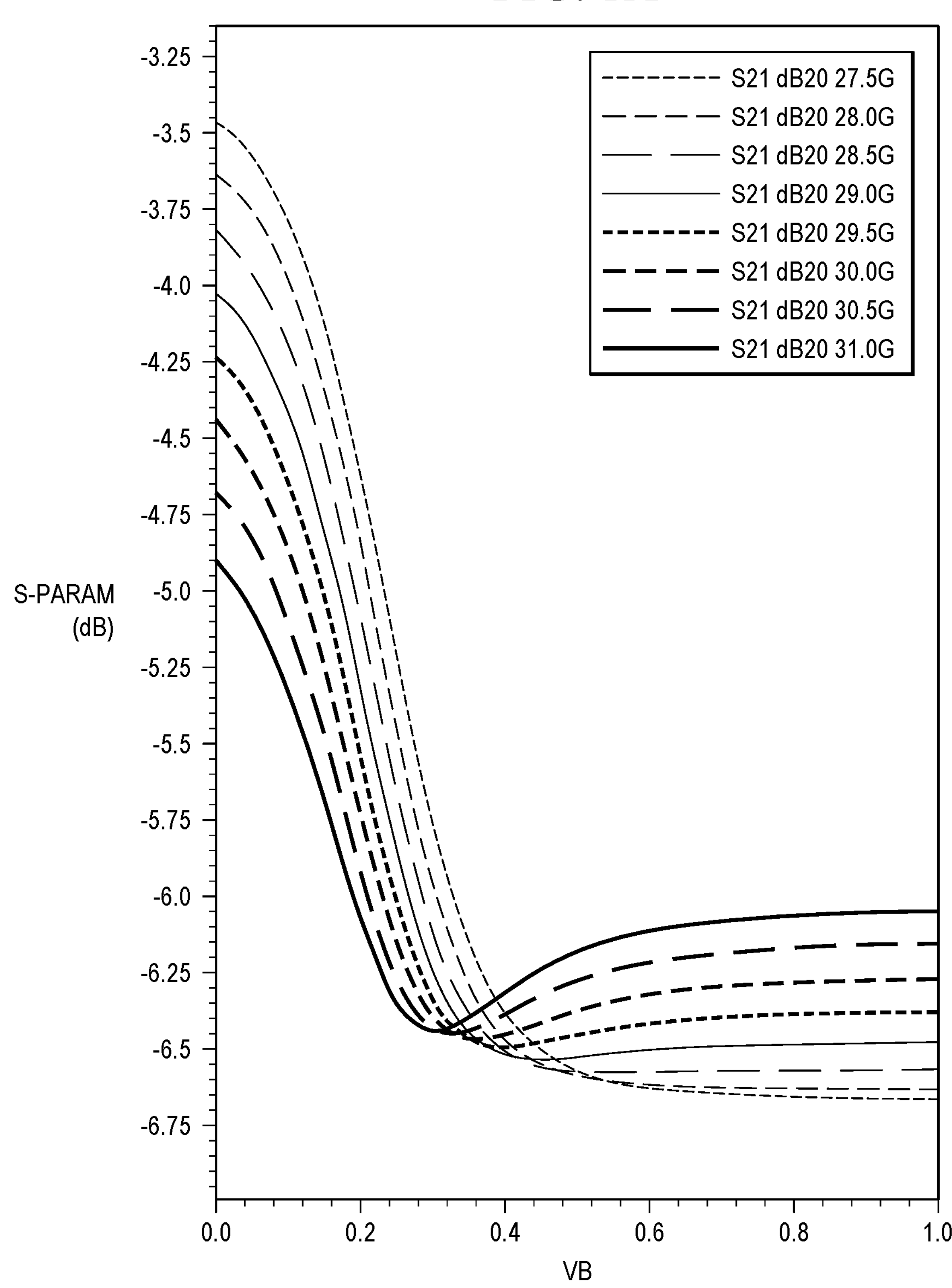
FIGS. 1A and 1B are graphs of example gain and phase shift of a reflection type phase shifter (RTPS).
Figure 1B:
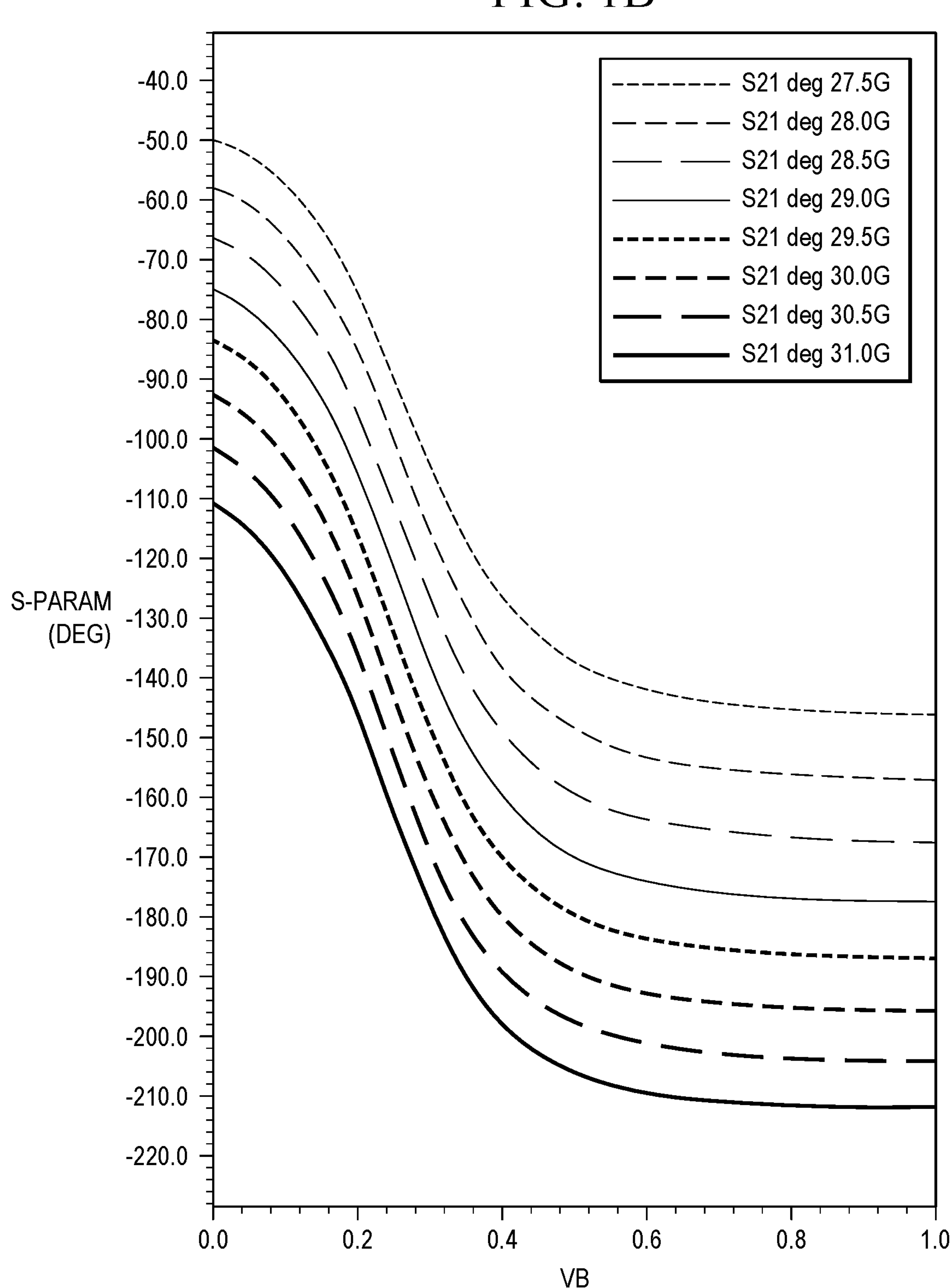

Reflection type phase shifters (RTPS) are passive phase shifters that may be used to implement bidirectional channels. However, the RTPS introduces undesirable gain variation with phase shift, which may degrade the performance of some applications (e.g., beamforming gain and sidelobe suppression). FIGS. 1A and 1B are graphs of example gain and phase shift of an RTPS. FIG. 1A shows the attenuation (in decibels) of the RTPS output versus the phase control voltage applied to set the phase shift provided by the RTPS. FIG. 1B shows the phase shift (in degrees) of the RTPS output versus the phase control voltage applied to set the phase shift provided by the RTPS. FIG. 1B shows a phase range of 95° at 27.5 gigahertz (GHz), and 100° at 31 GHz. FIG. 1A shows that attenuation ranges from about 3.5 dB to about 6.5 dB with variation in the phase control voltage (3 dB variation). An RTPS providing 360° of phase shift may exhibit attenuation of up to 10 dB.

Figure 2:
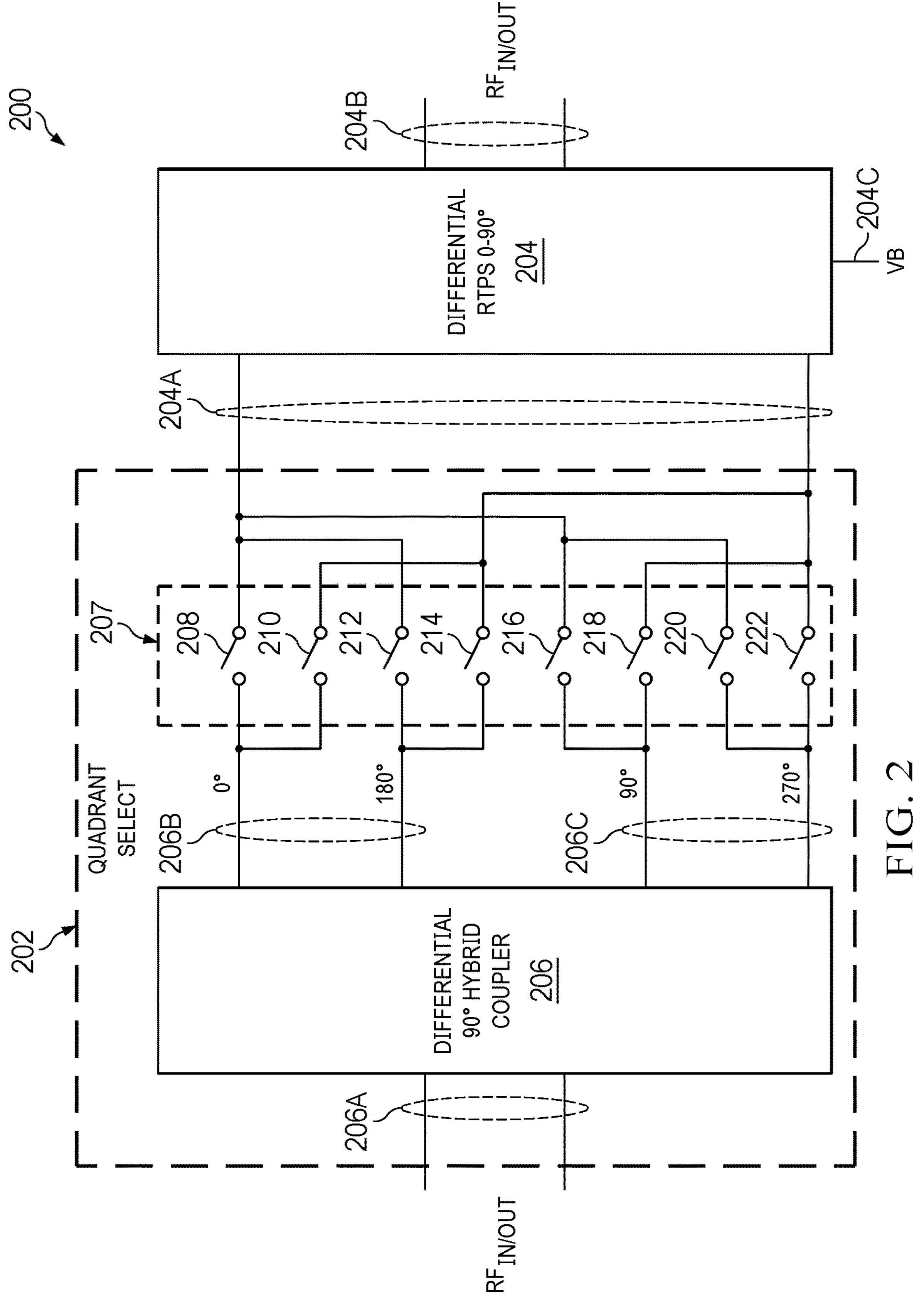
FIG. 2 is a block diagram of an example gain invariant bidirectional phase shifter as described herein.

The bi-directional phase shifter described herein provides 360° of phase shift with low (e.g., <0.4 dB) variation in attenuation. FIG. 2 is a block diagram of an example gain invariant bidirectional phase shifter 200. The gain invariant bidirectional phase shifter 200 includes a quadrant select circuit 202 and a differential RTPS 204. The quadrant select circuit 202 is bidirectional, and shifts an input signal by 0°, 90°, 180°, or 270°. That is, the quadrant select circuit 202 selects one of four quadrants for operation, where each quadrant represents a different 90° phase shift.

The quadrant select circuit 202 includes a differential quadrature hybrid coupler 206 and a switch network 207. The differential quadrature hybrid coupler 206 divides received signal power between two output ports. The outputs are attenuated by 3 dB and shifted in phase by 90° relative to one another. The differential quadrature hybrid coupler 206 may include a pair of quadrature hybrid couplers to shift the received differential signal. The differential quadrature hybrid coupler 206 includes differential input/output (I/O) port 206A, a differential I/O port 206B, and a differential I/O port 206C. For a differential signal received at the differential I/O port 206A, the differential quadrature hybrid coupler 206 outputs, at the differential I/O port 206B, a first differential signal (non-inverted and inverted versions of the received signal), and at the differential I/O port 206C, outputs a second differential signal (non-inverted and inverted versions of the signal at the differential I/O port 206B phase shifted by 90°). For a differential signal received at the differential I/O port 206B, the differential signal is passed to the differential I/O port 206A. For a differential signal received at the differential I/O port 206C, the differential signal is phase shifted by 90° (relative to the shift of any signal received at the I/O port 206B), and the phase shifted signal is passed to the differential I/O port 206A.

The differential RTPS 204 provides a selectable phase shift in a range of 0° to 90°. The differential RTPS 204 includes a differential I/O port 204A, a differential I/O port 204B, and a phase control terminal 204C. A phase control signal (VB) received at the phase control terminal 204C sets the phase shift provided by the differential RTPS 204. A differential signal received at the differential I/O port 204B is shifted and provided at the differential I/O port 204A. Similarly, a differential signal received at the differential I/O port 204A is shifted and provided at the differential I/O port 204B.

The switch network 207 includes a switch 208, a switch 210, a switch 212, a switch 214, a switch 216, a switch 218, a switch 220, and a switch 222. The switch 208 includes a first terminal coupled to a first terminal of the differential I/O port 206B and a second terminal coupled to a first terminal of the differential I/O port 204A. The switch 210 includes a first terminal coupled to a first terminal of the differential I/O port 206B and a second terminal coupled to a second terminal of the differential I/O port 204A. The switch 212 includes a first terminal coupled to a second terminal of the differential I/O port 206B and a second terminal coupled to the first terminal of the differential I/O port 204A. The switch 214 includes a first terminal coupled to a second terminal of the differential I/O port 206B and a second terminal coupled to the second terminal of the differential I/O port 204A. The switch 216 includes a first terminal coupled to a first terminal of the differential I/O port 206C and a second terminal coupled to the first terminal of the differential I/O port 204A. The switch 218 includes a first terminal coupled to a first terminal of the differential I/O port 206C and a second terminal coupled to the second terminal of the differential I/O port 204A. The switch 220 includes a first terminal coupled to a second terminal of the differential I/O port 206C and a second terminal coupled to the first terminal of the differential I/O port 204A. The switch 222 includes a first terminal coupled to a second terminal of the differential I/O port 206C and a second terminal coupled to the second terminal of the differential I/O port 204A.

Figure 3A:
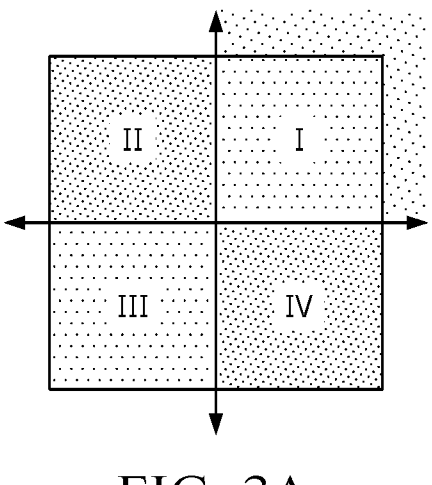
FIGS. 3A and 3B a graphs illustrating phase shifting in the gain invariant bidirectional phase shifter of FIG. 2.

To select operation in quadrant I, the switch 208 and the switch 214 may be closed. To select quadrant II, the switch 216 and the switch 222 may be closed. To select quadrant III, the switch 210 and the switch 212 may be closed. To select quadrant IV, the switch 218 and the switch 220 may be closed. FIG. 3A is graphic representation of the four quadrants selectable by the quadrant select circuit 202.

Figure 3B:
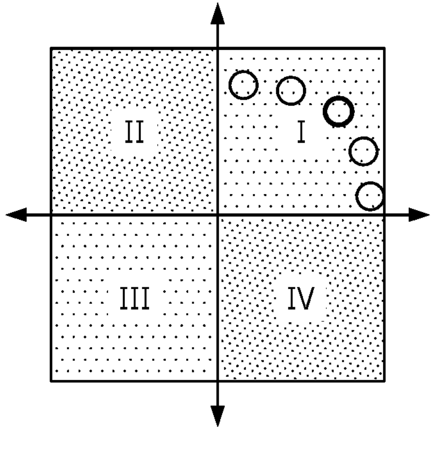

The differential RTPS 204 provides variable phase shifting within a 90° range in the quadrant selected by the quadrant select circuit 202. FIG. 3B is a graphic representation of a variety of phase shifts provided by the differential RTPS 204 when operating in quadrant I. Similar phase shifts are provided when operating in quadrants II, III, and IV.

Figure 4:
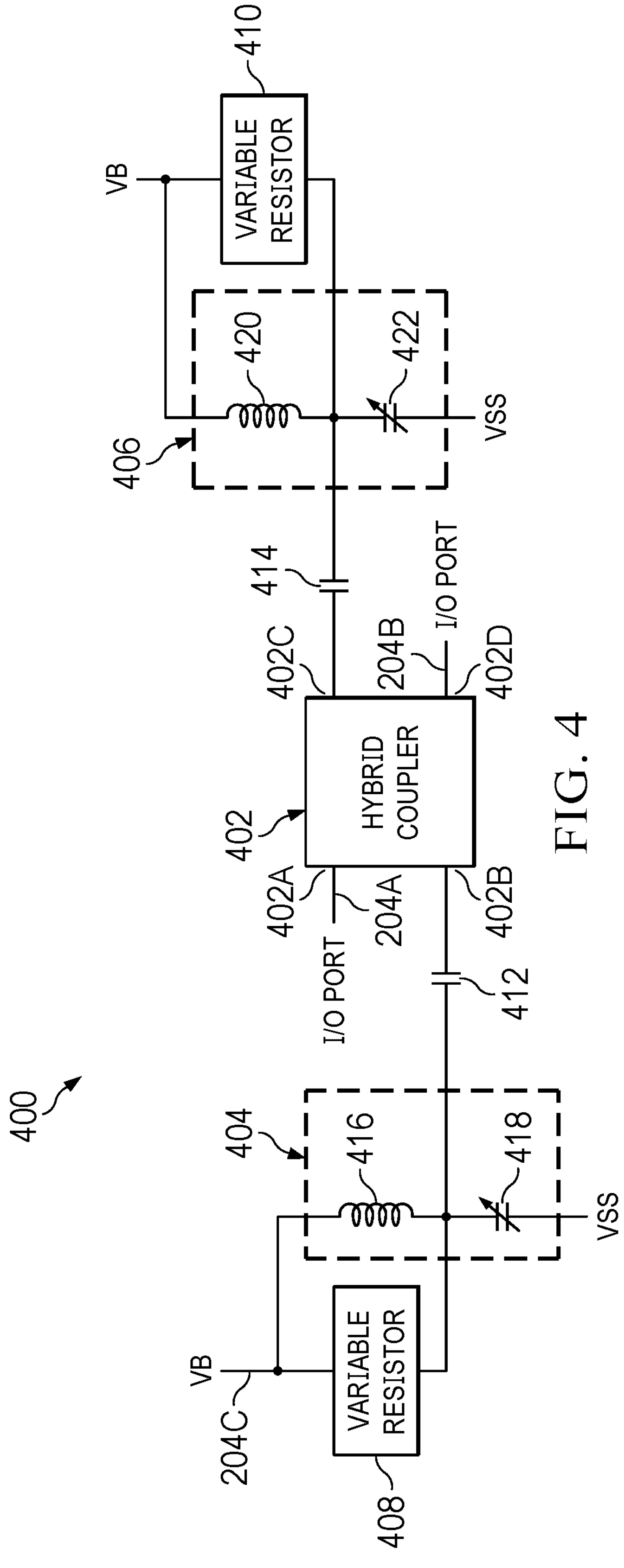
FIG. 4 is a block diagram of an example differential RTPS suitable for use in the gain invariant phase shifter of FIG. 2

FIG. 4 is a block diagram of an example implementation of an RTPS 400. The RTPS 400 is single-ended. The differential RTPS 204 can be implemented using two instances of the RTPS 400 (a first instance of the RTPS 400 for the positive (+) signal path and a second instance of the RTPS 400 for the negative (−) signal path). The RTPS 400 includes a hybrid coupler 402, a resonator circuit 404, a resonator circuit 406, a variable resistor 408, a variable resistor 410, a capacitor 412, and a capacitor 414. The hybrid coupler 402 includes ports 402A, 402B, 402C, and 402D. Ports 402A and 402D are I/O ports for input of signal to be phase shifted, and output of phase shifted signal. For example, a signal may be received at the port 402A, and a phase shifted signal output at the port 402D. Similarly, a signal may be received at the port 402D, and a phase shifted signal output at the port 402A.

The port 402B is coupled to the resonator circuit 404 and the variable resistor 408 via the capacitor 412. The resonator circuit 404 includes an inductor 416 and a variable capacitor 418. A first terminal of the inductor 416 is coupled to the phase control terminal 204C for receipt of the phase control signal. A second terminal of the inductor 416 is coupled to the variable resistor 408, the variable capacitor 418, and the capacitor 412. The variable capacitor 418 may be implemented using a varactor or other device having variable capacitance. A first terminal of the variable capacitor 418 is coupled to a reference voltage source (VSS), such as a ground terminal. The capacitance of the variable capacitor 418 is controlled by the phase control signal received at the phase control terminal 204C to set the phase shift provided by the RTPS 400.

The variable resistor 408 includes terminal coupled to the phase control terminal 204C and a terminal coupled to the inductor 416 and the capacitor 412. The resistance of the variable resistor 408 is controlled by the phase control signal received at the phase control terminal 204C. The resistance of the variable resistor 408 is varied based on the phase control signal to compensate the gain of the RTPS 400 (vary the gain of the RTPS 400). The variable resistor 408 allows the RTPS 400 to provide significantly lower variation in gain than other RTPS implementations.

The port 402C is coupled to the resonator circuit 406 and the variable resistor 410 via the capacitor 414. The coupling and operation of the resonator circuit 406, the variable resistor 408, and the capacitor 414 are similar to the resonator circuit 404, the variable resistor 408, and the capacitor 412. The capacitor 414 is similar to the capacitor 412. The resonator circuit 406 includes an inductor 420 and variable capacitor 422. The inductor 420 is similar to the inductor 416, and the variable capacitor 422 is similar to the variable capacitor 418. The variable resistor 410 is similar to the variable resistor 408.

Figure 5:
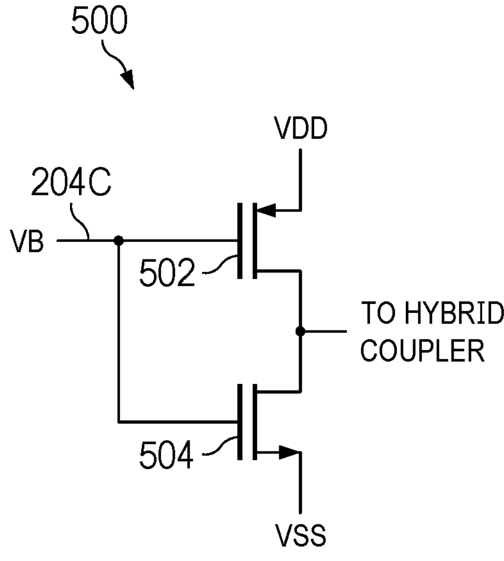
FIG. 5 is a schematic level diagram of a first example variable resistor suitable for use in the differential RTPS of FIG. 4.

FIG. 5 is a schematic level diagram of a first example variable resistor 500 suitable for use in the RTPS 400. The variable resistor 500 is an implementation of the variable resistor 408. The variable resistor 500 includes transistor 502 and a transistor 504. The transistor 502 may be a p-channel field effect transistor (PFET). The transistor 504 may be an n-channel field effect transistor (NFET). The gate of the transistor 502 and the gate of the transistor 504 are coupled to the phase control terminal 204C. The drain of the transistor 502 is coupled to the drain of the transistor 504 and to the hybrid coupler 402. The source of the transistor 502 is coupled to a power supply terminal. The source of the transistor 504 is coupled to a reference voltage terminal. When the phase control signal is zero volts, the transistor 502 is on (the resistance of the transistor 502 is low) and the transistor 504 is off (the resistance of the transistor 504 is high). As the phase control voltage increases, the resistance of the transistor 502 increases, and the resistance of the transistor 504 decreases.

Figure 6:
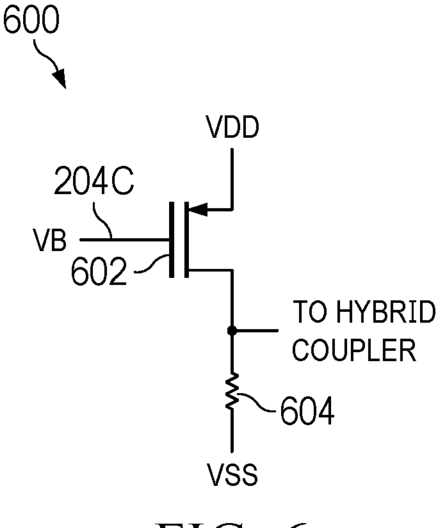
FIG. 6 is a schematic level diagram of a second example variable resistor suitable for use in the differential RTPS of FIG. 4.

FIG. 6 is schematic level diagram of a second example variable resistor 600 suitable for use in the RTPS 400. The variable resistor 600 is an implementation of the variable resistor 408. The variable resistor 600 includes transistor 602 and a resistor 604. The transistor 602 may be a PFET. The gate of the transistor 602 is coupled to the phase control terminal 204C. The drain of the transistor 602 is coupled to a first terminal of the resistor 604 and to the hybrid coupler 402. The source of the transistor 602 is coupled to a power supply terminal. A second terminal of the resistor 604 is coupled to a reference voltage terminal. When the phase control signal is zero volts, the transistor 602 is on (the resistance of the transistor 602 is low). As the phase control voltage increases, the resistance of the transistor 602 increases.

Figure 7:
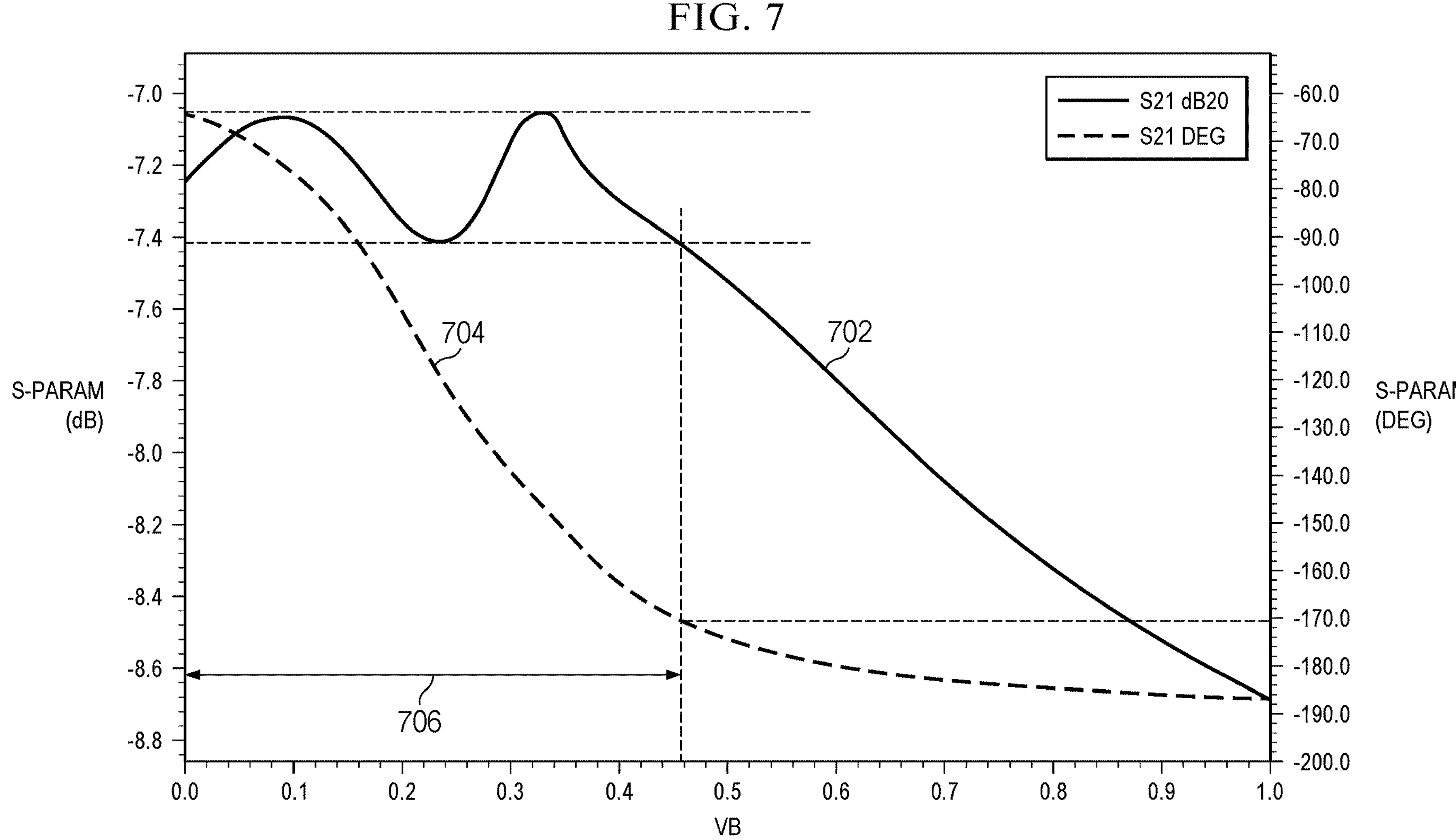
FIG. 7 is a graph of example gain and phase shift in the differential RTPS of FIG. 4.

FIG. 7 is graph of example gain and phase shift in the differential RTPS 204. Phase is illustrated as curve 704, and gain is illustrated as curve 702. In the example of FIG. 7, phase control voltage in the range 706 produces phase shift of 90° or greater in the differential RTPS 204, and in the range 706 the gain of the differential RTPS 204 varies by less than 0.4 dB. In contrast, as shown in FIG. 1A, other RTPS implementations may have a gain variation 3 dB or more over 90° of phase shift.

Figure 8:
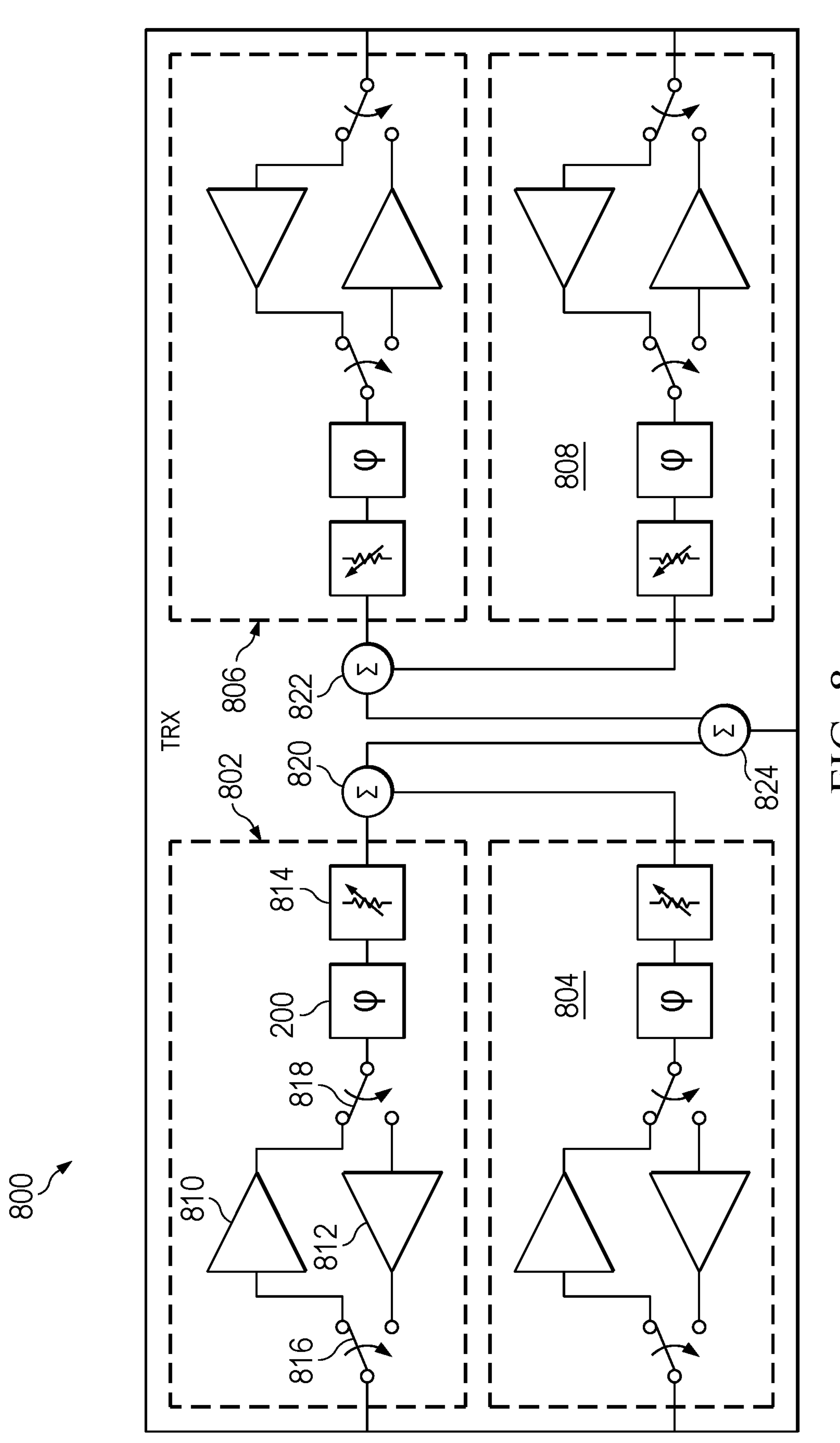
FIG. 8 is a block diagram of an example beamforming circuit that includes the gain invariant bidirectional phase shifter of FIG. 2.

FIG. 8 is a block diagram of an example beamforming circuit 800 that includes the gain invariant bidirectional phase shifter 200. The beamforming circuit 800 includes four bidirectional channels: channel 802, channel 804, channel 806, and channel 808. Some implementations of the beamforming circuit 800 may include a different number of channels. The beamforming circuit 800 includes summation circuit 820 coupled to the channel 802 and the channel 804, summation circuit 822 coupled to the channel 806 and the channel 808, and summation circuit 824 coupled to the channel 820 and the channel 822. The 820 sums outputs of the channel 802 and the channel 804. The summation circuit 822 sums outputs of the channel 806 and the channel 808. The summation circuit 824 sums outputs of the channel 820 and the channel 822.

The channel 802, the channel 804, the channel 806, and the channel 808 may be functionally and structurally similar to one another. Accordingly, description of the channel 802 is applicable to the channel 804, the channel 806, and the channel 808. The channel 802 includes a low noise amplifier 810, a power amplifier 812, the gain invariant bidirectional phase shifter 200, a variable attenuator 814, a switch 816, and switch 818. The switch 816 switchably couples an input of the low noise amplifier 810 and an output of the power amplifier 812 to a first I/O port of the channel 802. The input of the low noise amplifier 810 is coupled to the port of the channel 802 for receiving a signal, and the output of the power amplifier 812 is coupled to the I/O port of the channel 802 for transmitting a signal. The switch 818 switchably couples an output of the low noise amplifier 810 and an input of the power amplifier 812 to the gain invariant bidirectional phase shifter 200. The output of the low noise amplifier 810 is coupled to the gain invariant bidirectional phase shifter 200 for receiving a signal, and the input of the power amplifier 812 is coupled to the gain invariant bidirectional phase shifter 200 for transmitting a signal.

The gain invariant bidirectional phase shifter 200 is coupled to the variable attenuator 814, and, when receiving a signal, provides phase shifted signal to the variable attenuator 814. When transmitting a signal, the gain invariant bidirectional phase shifter 200 phase shifts signal received from the variable attenuator 814. The variable attenuator 814 is coupled to a second I/O port of the channel 802. Because the gain invariant bidirectional phase shifter 200 is bidirectional, a single instance of the gain invariant bidirectional phase shifter 200 provides phase shifting for both received and transmitted signals. The variable attenuator 814 attenuates signal received from the gain invariant bidirectional phase shifter 200 and signal provided to the gain invariant bidirectional phase shifter 200.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead with little or no change to the remaining circuitry. For example, a metal-oxide-silicon FET ("MOSFET") (such as an n-channel MOSFET, nMOSFET, or a p-channel MOSFET, pMOSFET), a bipolar junction transistor (BJT—e.g. NPN or PNP), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other types of device structure transistors. Furthermore, the devices may be implemented in/over a silicon substrate (Si), a silicon carbide substrate (SiC), a gallium nitride substrate (GaN) or a gallium arsenide substrate (GaAs).

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter.

Modifications are possible in the described embodiments, and other embodiments are possible, within the scope of the claims.

What is claimed is:

1. An apparatus comprising:

a coupler including a first port, a second port, and a third port, in which the second port and the third port have a 90-degree phase shift from each other:

a phase shifter having a phase control terminal and a variable resistance circuit coupled to the phase control terminal; and a switch network coupled between the second and third ports and the phase shifter.

2. The apparatus of claim 1, wherein the coupler is a first hybrid coupler, and the phase shifter includes:

a second hybrid coupler having a first port;

a resonator circuit coupled to the first port of the second hybrid coupler; and the variable resistance circuit coupled to the resonator circuit.

3. The apparatus of claim 2, wherein the resonator circuit has a phase control terminal, and the variable resistance circuit includes:

a first transistor including:

a source coupled to a power supply terminal;

a gate coupled to the phase control terminal of the resonator circuit; and a drain coupled to a port of the second hybrid coupler; and a second transistor including:

a source coupled to a reference voltage terminal;

a gate coupled to the phase control terminal of the resonator circuit; and a drain coupled to the port of the second hybrid coupler.

4. The apparatus of claim 2, wherein the resonator circuit has a terminal coupled to the phase control terminal, and the variable resistance circuit includes:

a first transistor including:

a source coupled to a power supply terminal;

a gate coupled to the phase control terminal of the resonator circuit; and a drain coupled to a port of the second hybrid coupler; and a resistor including:

a first terminal coupled to a reference voltage terminal; and a second terminal coupled to the port of the second hybrid coupler.

5. The apparatus of claim 2, wherein:

the second hybrid coupler includes a second port;

the resonator circuit is a first resonator circuit;

the variable resistance circuit is a first variable resistance circuit; and the phase shifter includes:

a second resonator circuit coupled to the second port of the second hybrid coupler; and a second variable resistance circuit coupled to the second resonator circuit.

6. The apparatus of claim 5, wherein the first resonator circuit includes a first capacitor having a first adjustable capacitance, the first capacitor has a first capacitance control terminal coupled to the phase control terminal; and wherein the second resonator circuit includes a second capacitor having a second adjustable capacitance, the second capacitor has a second capacitance control terminal coupled to the phase control terminal.

7. The apparatus of claim 5, further comprising a first capacitor coupled between the first resonator circuit and the first port of the second hybrid coupler, and a second capacitor coupled between the second resonator circuit and the second port of the second hybrid coupler.

8. The apparatus of claim 5, wherein the second hybrid coupler has a third port and a fourth port having a 90-degree phase shift from each other; and wherein the phase shifter has differential terminals coupled to the third and fourth ports of the second hybrid coupler.

9. The apparatus of claim 1, wherein:

the coupler is a differential quadrature hybrid coupler;

the first port includes first differential terminals;

the second port includes second differential terminals;

the third port includes third differential terminals; and the phase shifter includes a differential phase shifter having fourth differential terminals coupled to the switch network.

10. The apparatus of claim 9, wherein the switch network includes:

a first switch coupled between a first terminal of the second differential terminals and a first terminal of the fourth differential terminals;

a second switch coupled between the first terminal of the second differential terminals and a second terminal of the fourth differential terminals;

a third switch coupled between a second terminal of the second differential terminals and the first terminal of the fourth differential terminals; and a fourth switch coupled between the second terminal of the second differential terminals and the second terminal of the fourth differential terminals.

11. The apparatus of claim 10, wherein the switch network includes:

a fifth switch coupled between a first terminal of the third differential terminals and the first terminal of the fourth differential terminals;

a sixth switch coupled between the first terminal of the third differential terminals and the second terminal of the fourth differential terminals;

a seventh switch coupled between a second terminal of the third differential terminals and the first terminal of the fourth differential terminals; and an eighth switch coupled between the second terminal of the third differential terminals and the second terminal of the fourth differential terminals.

12. The apparatus of claim 1, wherein the phase shifter includes a reflection type phase shifter.

13. The apparatus of claim 1, wherein the coupler, the switch network, and the phase shifter are part of a bidirectional phase shifter.

14. The apparatus of claim 1, wherein the coupler, the switch network, and the phase shifter are part of a beamforming circuit.

15. The apparatus of claim 1, wherein the phase shifter includes at least two bidirectional input/output (I/O) ports.

16. The apparatus of claim 1, wherein the phase shifter includes two differential bidirectional input/output (I/O) ports.

* * * * *